United States Patent
Dierichs

(10) Patent No.: US 7,108,960 B2
(45) Date of Patent: Sep. 19, 2006

(54) LITHOGRAPHIC APPARATUS AND DEVICE MANUFACTURING METHOD

(75) Inventor: Marcel Mathijs Theodore Marie Dierichs, Venlo (NL)

(73) Assignee: ASML Netherlands B.V., Veldhoven (NL)

(*) Notice: Subject to any disclaimer, the term of this patent is extended or adjusted under 35 U.S.C. 154(b) by 369 days.

(21) Appl. No.: 10/648,787

(22) Filed: Aug. 27, 2003

(65) Prior Publication Data

US 2004/0106068 A1    Jun. 3, 2004

(30) Foreign Application Priority Data

Aug. 30, 2002  (EP) .................... 02256037

(51) Int. Cl.
*G03C 5/00* (2006.01)
*G03C 5/04* (2006.01)

(52) U.S. Cl. .............. 430/311; 430/394; 430/396

(58) Field of Classification Search ............ 430/311, 430/394, 396; 355/35
See application file for complete search history.

(56) References Cited

U.S. PATENT DOCUMENTS

| | | | | |
|---|---|---|---|---|
| 4,929,083 A | * | 5/1990 | Brunner | ............... 356/400 |
| 5,081,635 A | * | 1/1992 | Wakabayashi et al. | ........ 372/57 |
| 6,359,678 B1 | | 3/2002 | Ota | ........................... 355/53 |
| 2002/0109103 A1 | | 8/2002 | Mulkens et al. | ......... 250/492.1 |
| 2005/0110965 A1 | * | 5/2005 | Hendriks et al. | ............. 355/18 |

FOREIGN PATENT DOCUMENTS

| | | |
|---|---|---|
| EP | 1 235 114 A1 | 8/2002 |
| EP | 1235114 A1 * | 8/2002 |
| JP | 6-20925 | 1/1994 |
| JP | 62204527 A * | 9/1997 |
| JP | 11-26375 | 1/1999 |
| JP | 11-251239 | 9/1999 |

OTHER PUBLICATIONS

T. Ito, Mask Exposure Apparatus, Sep. 9, 1987, Hitachi Ltd., JP 62 204527☐☐Patent Abstracts of Japan, vol. 012, No. 063 (E-585), Feb. 25, 1988.*

* cited by examiner

*Primary Examiner*—W. B. Perkey
*Assistant Examiner*—Vivian Nelson
(74) *Attorney, Agent, or Firm*—Pillsbury Winthrop Shaw Pittman, LLP

(57) ABSTRACT

A sensor is used to detect luminescent radiation that is radiated from a reflector as a result of state changes induced by a beam of radiation being incident on an area of the reflector. The intensity of the luminescent radiation at particular wavelengths can be used to determine the intensity of the beam of radiation.

13 Claims, 2 Drawing Sheets

LITHOGRAPHIC APPARATUS AND DEVICE MANUFACTURING METHOD

CROSS REFERENCE TO RELATED APPLICATION

This application claims priority to European Application 02256037.9, filed Aug. 30, 2002, the entire contents of which are incorporated herein by reference.

BACKGROUND OF THE INVENTION

1. Field of the Invention

The present invention relates to a lithographic projection apparatus and lithographic apparatus and device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In order to ensure that the resist receives the correct exposure dose, it is important that the intensity of the radiation beam at substrate level be controlled during exposure. Unfortunately, intensity measurement during exposure is very difficult to perform without either altering the intensity or altering the intensity distribution (uniformity). Therefore in conventional lithographic apparatus, a combination of sensors is typically used to minimize the disturbance: a first sensor normally attached to the substrate table such that it can be positioned in the beam for measurements between exposures, and a second sensor at a suitable position in the optical path, for example mounted on a portion of a reflector, to measure the intensity of a region of the beam during exposure. Using the first sensor between exposures, very accurate measurements may be made of the beam intensity and the beam intensity distribution, and the characteristics of the apparatus may be analyzed by measuring the relative intensities measured by the different sensors under different conditions. This data can then be used to predict the intensity at substrate level using only measurements by the second sensor. The disadvantage of this is that there will always be either a disturbance in the intensity due to the presence of the second sensor.

Alternatively, one of the reflectors in the apparatus may be partially silvered, allowing a portion of the incident radiation to pass through the reflector to a sensor behind the reflector, or may redirect a portion of the beam to a sensor. This arrangement intrinsically reduces the intensity of the beam, which in turn reduces the throughput of the apparatus. Apparatus using EUV radiation are especially sensitive to this problem since EUV reflectors are naturally very inefficient. High reflectivity mirrors for EUV radiation are not currently available. Furthermore, in lithographic projection apparatus employing EUV radiation, the beam is radiated in an evacuated system to prevent losses in intensity. Therefore the beam intensity sensors must also be located within the evacuated system and must therefore be designed to be vacuum tolerant and to not outgas when placed in the vacuum.

SUMMARY OF THE INVENTION

It is an aspect of the present invention to provide a device to determine the intensity of the radiation beam that can determine the intensity of the beam across its cross-sectional area and is compatible for use with EUV apparatus.

This and other aspects are achieved according to the present invention in a lithographic apparatus including a radiation system configured to provide an unpatterned beam of radiation; a support configured to support a patterning device, the patterning device configured to pattern the unpatterned beam according to a desired pattern; a substrate table configured to hold a substrate; a projection system configured to project the patterned beam onto a target portion of the substrate; a sensor configured to detect luminescent radiation radiated by at least one region of an area on a component of the apparatus traversed by the unpatterned beam or the patterned beam, and a control device configured to determine the intensity, in the at least one region, of the unpatterned beam or the patterned beam from the detected luminescent radiation.

According to another aspect, the sensor detects the luminescent radiation from a plurality of regions of the area on the component on which the unpatterned beam or the patterned beam is incident and the control device determines the intensity of the unpatterned beam or the patterned beam in each of the regions.

The intensity, in the region, of the unpatterned beam or the patterned projection beam may be determined from the detected luminescent radiation. Luminescence is the spontaneous emission of radiation from a thermally excited substance. Several different types of luminescence are known and identified based upon the mechanism by which the thermally excited state is created, for example photoluminescence (the excited state is produced by the absorption of photons), radioluminescence (arising from excitation by high-energy particles or radiation), sonoluminescenee (arising from excitation by sound waves), triboluminescence (arising from the rubbing together of the surface of certain solids) and chemiluminscence (arising from a chemical reaction). Additionally, the luminescence can also be identified by the relationship between excitation and emission, for example fluorescence (emission occurs only during the excitation of a substance) and phosphorescence (emission occurs or continues after excitation of a substance has ceased).

The degree of luminescence (presumably caused by state transitions of the atoms in the surface induced by the incident beam of radiation) produced by a component of the apparatus by the incidence of the beam is determined by several factors including the properties of the incident energy beam (for example photon energy and wavelength) and the properties of the component (for example the materials used).

The element from which the luminescent radiation is detected may be a multilayer stack forming a distributed Bragg reflector or a grazing-incidence collector. In particular, the element may be part of the projection system and/or part of the radiation system and/or may be the first reflector on which the unpatterned beam is incident. The element may also be part of the illuminator.

The sensor may detect the combined intensity of the luminescent radiation over a broad spectrum. Alternatively, to more accurately determine the intensity of the beam of radiation, the sensor may detect the intensity of luminescent radiation in one or more narrow bands of wavelengths that correspond to the expected wavelengths of radiation to be emitted as a result of state transitions of the atoms in the reflector induced by the beam of radiation.

Since the radiation beam is EUV radiation, the patterning device, the projection system, the substrate, and at least part of the radiation system are contained in an evacuated chamber to reduce losses in beam intensity due to absorption of the EUV radiation. However, since the luminescent radiation will be at a different wavelength, for example within the visible spectrum, it will not be absorbed to the same extent as the EUV radiation. In a preferred embodiment, therefore, the sensor can be located outside of the evacuated chamber. Consequently the sensor does not need to be vacuum compatible.

The determined intensity of the region(s) of the unpatterned radiation beam or the patterned radiation beam from which the luminescent radiation is detected may be used to adjust the exposure time of the target portion of the substrate, the intensity of the unpatterned beam of radiation produced by the radiation system, and/or the intensity of the patterned beam.

According to a further aspect of the invention there is provided a device manufacturing method including providing an unpatterned beam of radiation using a radiation system; projecting a patterned beam of radiation onto a target portion of a layer of radiation-sensitive material at least partially covering a substrate; and detecting luminescent radiation radiated by at least one region of an area on a component traversed by the unpatterned beam or the patterned beam on which the beam is incident; and determining the intensity, in the at least one region, of the unpatterned beam or the patterned beam from the detected luminescent radiation.

According to another aspect, the method includes detecting the luminescent radiation from a plurality of regions of the area on the component on which the unpatterned beam or the patterned beam is incident, and determining the intensity of the unpatterned beam or the patterned beam in each of the regions.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
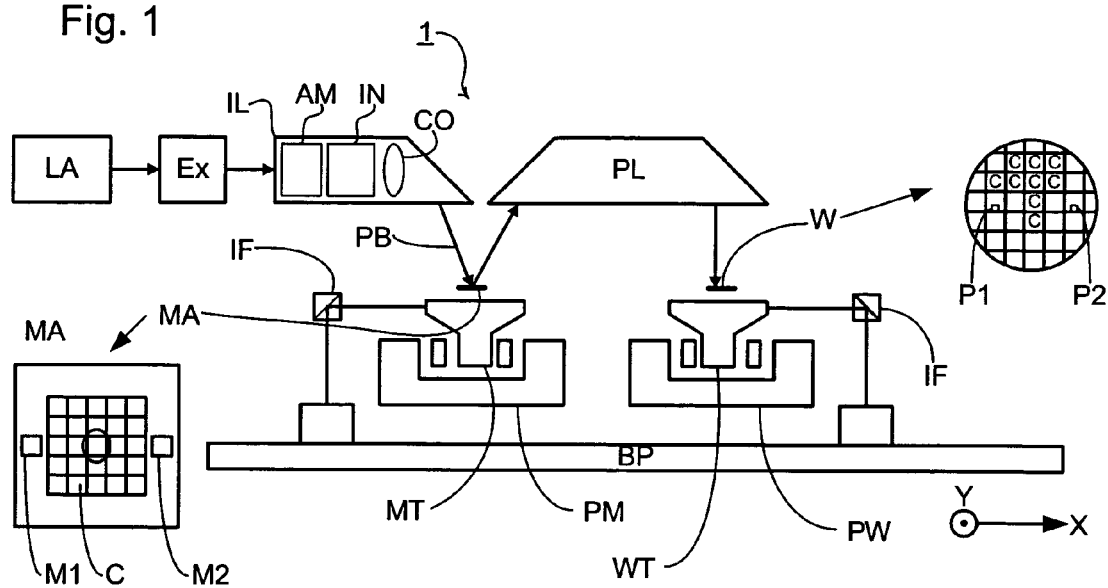
FIG. 1 depicts a lithographic projection apparatus according to an embodiment of the present invention.

FIG. 1 schematically depicts a lithographic projection apparatus 1 according to an embodiment of the invention. The apparatus 1 includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM configured to set the outer and/or inner radial extent (commonly referred to as σ-outer and σ-inner, respectively) of the intensity distribution in the beam PB. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

1. The depicted apparatus can be used in two different modes:

In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction," e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
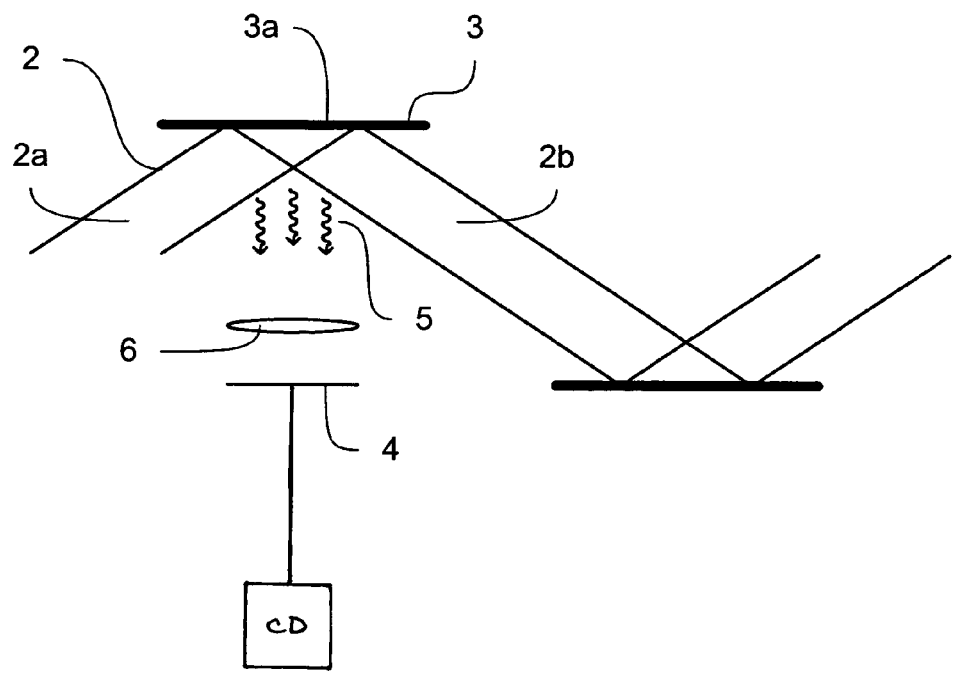
FIG. 2 depicts an arrangement of the sensor according to an embodiment of the present invention.

FIG. 2 depicts an embodiment of the present invention. A beam of radiation 2 traverses a reflector 3. The radiation will cause electrons in atoms of an area of a surface 3a of the reflector 3 to move to higher energy states. As the electrons return to lower energy levels, the atoms radiate luminescent radiation. The wavelengths of the luminescent radiation depend on the quanta of energy released when the electrons drop to a lower energy level. The luminescent radiation emitted by the reflector when the radiation beam is incident on it is therefore comprised of radiation in a plurality of discrete bands of wavelengths. The intensity of the luminescent radiation in each waveband and the position of the wavebands will be dependent on the material from which the reflector is made and the intensity of the incident beam.

The luminescent radiation is radiated in all directions. Therefore a sensor 4 may be placed to detect the luminescent radiation from the surface area 3a without being within the incident path 2a or the reflected path 2b of the beam of radiation 2. The sensor 4 may be, for example, a CCD camera or a single diode.

The sensor 4 may detect the luminescent radiation 5 from the entire surface area 3a of the reflector 3 on which the beam of radiation 2 is incident. Alternatively, with the use of appropriate optics, such as a lens 6, the image of the surface area 3a of the reflector 3 on which the beam of radiation 2 is incident may be projected onto the sensor 4. The sensor 4 can then be used to monitor the intensity of the beam of radiation over its cross-section. This is useful as, in a radiation beam for example, it is desirable to ensure that the beam intensity is uniform across its cross-section.

Whether the sensor 4 detects the luminescent radiation 5 from the entire surface area 3a of the reflector on which the beam 2 is incident, or from discrete regions within it, the sensor 4 may detect the total luminescent radiations (i.e. of substantially all wavelengths) from the reflector 3, from which a control device CD can estimate the intensity of the beam of radiation or the region of the beam of radiation 2. Alternatively, the sensor 4 may detect the intensity of the luminescent radiation 5 at a plurality of specific wavelengths associated with electron state changes in the material of the reflector 3. The control device can then determine the intensity of the beam of radiation or the intensity of the region of the beam of radiation more accurately from the probabilities of state changes in the atoms of the reflector and the intensities of the luminescent radiation in each of the associated wavelengths.

From monitoring the intensity of specific wavelengths, it is also possible to determine contamination on the reflector. For instance, it may be possible to determine the composition and/or the thickness of a contamination layer on the surface of the reflector since the characteristic electron state charges of the contaminant will be different to those of the reflector.

The sensor may be used in conjunction with any surface on which a beam of radiation is incident. In particular, it may be used with the unpatterned beam of radiation or the patterned beam. In the case of the former, the sensor 4 is preferably used in conjunction with a reflector 3 that is close to the radiation source. At each reflection, the intensity of the beam of radiation 2 decreases and hence the amount of luminescent radiation irradiated from each surface decreases. The sensor may therefore be used in conjunction with a reflector that is part of the radiation system or immediately down-beam of the radiation system.

In particular, the sensor may be used in conjunction with field and/or pupil faceted mirrors in the illumination system. These are used to improve the uniformity of the intensity over the cross section of the beams. The facet mirrors may need to be adjusted to attain the required field intensity distribution. The sensor can be used to determine the intensity distribution of the beam either at the facet mirrors or at a subsequent element. The required adjustments to the facet mirrors can therefore be determined. Further information on field and pupil facet mirrors is explained in U.S. Pat. No. 6,771,352.

It will be appreciated that the sensor 4 may also be used in conjunction with a reflector that is as far down-beam as practical so as to be able to monitor the losses of as many reflectors as possible. As an alternative, the sensor could be used in conjunction with a reflector immediately down-beam of the patterning device. This could be used, for example, when the patterning device is a programmable patterning device, to confirm that the intensity distribution across the patterning device as expected and/or provide feedback to the programmable patterning device to provide necessary corrections.

Figure 3:
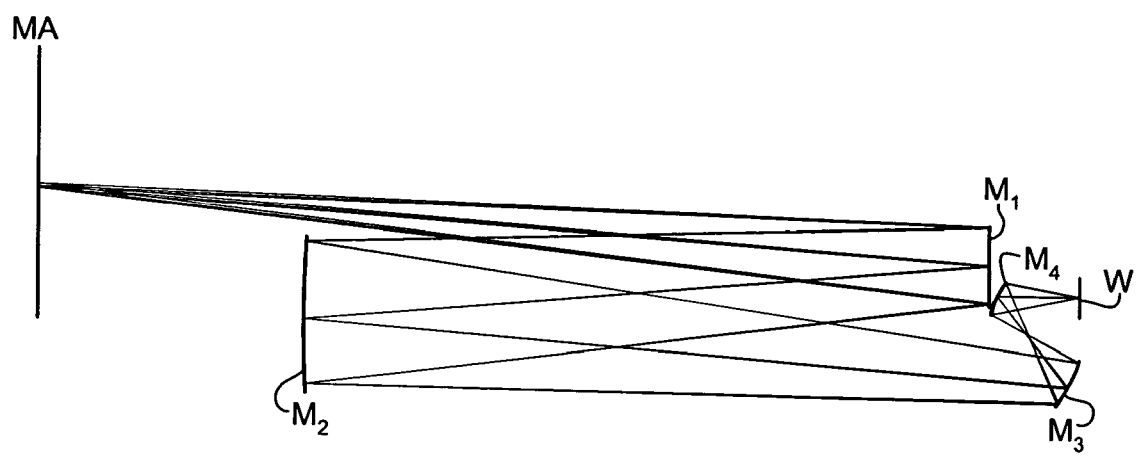
FIG. 3 depicts a projection system comprised of reflectors.

The sensor 4 may also be used in conjunction with a reflector 3 in the projection system. Since no suitable material for manufacturing refractive lenses usable with EUV radiation is known, projection systems for lithographic apparatus making use of EUV radiation for the beam must be based on reflective optics. An example of such a projection system is shown in FIG. 3. The reflectors $M_1$, $M_2$, $M_3$, $M_4$ are used to project an image of the patterning device MA onto the substrate W. Further information on projection systems using reflective optics may be found in U.S. Pat. No. 6,556,648.

The sensor 4 may simply be adjacent to the reflector 3. However, this need not be the case. In apparatus in which the beam of radiation 2 is EUV radiation, then the beam path may be within an evacuated chamber to reduce the intensity loss. However, the luminescent radiation 5 will have a different wavelength and therefore it will be less susceptible to intensity loss. The sensor 4 may, therefore, be located outside of the evacuated chamber, with the luminescent radiation 5 passing through a panel that is transmissive to the luminescent radiation.

Determining the intensity of regions of the projection beams or the patterned beam (or of the entirety of the beams) may be used to ensure that the resist on the substrate receives the correct exposure. This may be done, for example, by adjusting, with the control device for example, at least one of the exposure time of the resist, the intensity of the unpatterned beam of radiation produced by the radiation system, and the intensity of the patterned beam of radiation, in response to the measured intensity values.

While specific embodiments of the invention have been described above, it will be appreciated that the invention may be practiced otherwise than as described. The description is not intended to limit the invention.

What is claimed is:

1. A lithographic projection apparatus comprising:
   a radiation system configured to provide an unpatterned beam of radiation;
   a support configured to support a patterning device, the patterning device configured to pattern the unpatterned beam according to a desired pattern;
   a substrate table configured to hold a substrate;
   a projection system configured to project the patterned beam onto a target portion of the substrate,
   a sensor configured to detect luminescent radiation radiated by at least one region of an area on a component of the apparatus traversed by the unpatterned beam or the patterned beam; and
   a control device configured to determine the intensity, in the at least one region, of the unpatterned beam or the patterned beam from the detected luminescent radiation, wherein the component is a reflector within one of the projection system and the radiation system.

2. A lithographic projection apparatus according to claim 1, wherein the sensor detects the luminescent radiation from a plurality of regions of the area on which the unpatterned beam or the patterned beam is incident and the control device determines the intensity of the patterned beam or the unpatterned beam in each of the regions.

3. A lithographic projection apparatus according to claim 2, wherein the sensor detects the total intensity of luminescent radiation radiated by the plurality of regions.

4. A lithographic projection apparatus according to claim 2, wherein the sensor detects the intensity of luminescent radiation radiated by the plurality of regions at one or more wavelengths.

5. A lithographic projection apparatus according to claim 1, wherein the sensor is not in an incident path or a reflected path of the unpatterned beam or the patterned beam.

6. A lithographic projection apparatus according to claim 1, wherein the component is a multilayer stack forming a distributed Bragg reflector.

7. A lithographic projection apparatus according to claim 1, wherein the component is a first reflector on which the unpatterned beam is incident.

8. A lithographic projection apparatus according to claim 1, wherein the sensor detects the total intensity of luminescent radiation radiated by the at least one region.

9. A lithographic projection apparatus according to claim 1, wherein the sensor detects the intensity of luminescent radiation radiated by the at least one region at one or more wavelengths.

10. A lithographic projection apparatus according to claim 1, wherein the patterning device, the projection system, the substrate and at least part of the radiation system are contained in an evacuated chamber, the at least one region of the area, from which the sensor detects luminescent radiation, is within the evacuated chamber, and the sensor is located outside of the evacuated chamber.

11. A lithographic projection apparatus according to claim 1, wherein the control device is configured to adjust at least one of the exposure time of the target portion of the substrate, the intensity of the unpatterned projection beam of radiation produced by the radiation system, and the intensity distribution of the patterned projection beam in response to the detected luminescent radiation.

12. A device manufacturing method, comprising:
   providing an unpatterned beam of radiation using a radiation system;
   projecting a patterned beam of radiation onto a target portion of a layer of radiation-sensitive material at least partially covering a substrate using a projection system;
   detecting luminescent radiation radiated by at least one region of an area on a component traversed by the unpatterned beam or the patterned beam; and
   determining the intensity, in the at least one region, of the unpatterned beam or the patterned beam from the detected luminescent radiation, wherein the component is a reflector within one of the projection system and the radiation system.

13. A device manufacturing method according to claim 12, wherein detecting luminescent radiation further comprises detecting luminescent radiation from a plurality of regions of the area on the component on which the unpatterned beam or the patterned beam is incident and determining the intensity includes determining the intensity of the unpatterned beam or the patterned beam in each of the regions.

* * * * *